United States Patent
Roy et al.

(10) Patent No.: US 7,875,915 B2
(45) Date of Patent: Jan. 25, 2011

(54) INTEGRATED CIRCUIT COMPRISING A PHOTODIODE OF THE FLOATING SUBSTRATE TYPE AND CORRESPONDING FABRICATION PROCESS

(75) Inventors: François Roy, Seyssins (FR); Arnaud Tournier, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 459 days.

(21) Appl. No.: 11/432,675

(22) Filed: May 10, 2006

(65) Prior Publication Data

US 2006/0255371 A1 Nov. 16, 2006

(30) Foreign Application Priority Data

May 13, 2005 (FR) .................... 05 04835

(51) Int. Cl.
*H01L 31/062* (2006.01)
*H01L 31/113* (2006.01)

(52) U.S. Cl. .................. 257/292; 257/79; 257/408; 257/431; 257/462; 257/509; 257/E21.345; 257/E21.458; 257/E27.128; 257/E27.131; 257/E21.133; 257/E29.039; 257/E31.033; 257/E31.032; 257/E31.053; 438/59; 438/174; 438/181; 438/217; 438/309

(58) Field of Classification Search .................. 257/79, 257/292, 408, 431, 462, 509, E21.345, E21.458, 257/E27.128, E27.131–E27.133, E29.039, 257/E31.033, E31.032, E31.053; 438/79, 438/292, 408, 431, 462, 509, E21.345, E21.458, 438/E27.128, E27.131–E27.133, E29.039, 438/E31.033, E31.032, E31.053
See application file for complete search history.

(56) References Cited

U.S. PATENT DOCUMENTS

| 4,517,719 | A | 5/1985 | Okumura et al. | |
|---|---|---|---|---|
| 6,096,616 | A * | 8/2000 | Nistler et al. | 438/305 |
| 6,642,561 | B2 * | 11/2003 | Kakumoto et al. | 257/292 |
| 6,888,195 | B2 * | 5/2005 | Saito et al. | 257/328 |
| 2001/0015468 | A1 * | 8/2001 | Miida | 257/431 |
| 2002/0024071 | A1 * | 2/2002 | Kawajiri et al. | 257/292 |
| 2004/0017496 | A1 | 1/2004 | Koizumi et al. | |
| 2004/0094784 | A1 * | 5/2004 | Rhodes et al. | 257/291 |
| 2004/0173824 | A1 | 9/2004 | Nagasaki et al. | |
| 2004/0201047 | A1 | 10/2004 | Takamura | |

(Continued)

FOREIGN PATENT DOCUMENTS

EP 1 517 375 A2 3/2005

(Continued)

OTHER PUBLICATIONS

Patent Abstracts of Japan, vol. 2003, No. 08, Aug. 6, 2003; and JP 2003 124497 A (Shirinkusu KK), Apr. 25, 2003.

(Continued)

*Primary Examiner*—Lynne A Gurley
*Assistant Examiner*—Meiya Li
(74) *Attorney, Agent, or Firm*—Gardere Wynne Sewell LLP

(57) ABSTRACT

An integrated circuit includes at least one photodiode associated with a read transistor. The photodiode is formed from a stack of three semiconductor layers comprising a buried layer, an floating substrate layer and an upper layer. The drain region and/or the source region of the transistor are incorporated within the upper layer. The buried layer is electrically isolated from the upper layer so as to allow the buried layer to be biased independently of the upper layer.

14 Claims, 8 Drawing Sheets

U.S. PATENT DOCUMENTS

2004/0206991 A1  10/2004  Yato
2005/0023553 A1   2/2005  Rhodes
2006/0186505 A1   8/2006  Adkisson et al.
2006/0244090 A1*  11/2006  Roy et al. .................. 257/462
2006/0258042 A1*  11/2006  Roy et al. .................... 438/59

FOREIGN PATENT DOCUMENTS

JP          2001-053260       2/2001

OTHER PUBLICATIONS

Patent Abstracts of Japan, vol. 2003, No. 12, Dec. 5, 2003; and JP 2004 187017 A (Innotech corp.), Jul. 2, 2004.

Miida, et al., "A 1.5MPixel imager with localized hole modulation method," Solid-State Circuits Conference, 2002; Digest of Technical Papers, 2002 IEEE International Feb. 3-7, 2002, Piscataway, NJ, USA, IEEE, vol. 1, 2002, pp. 42-442, XP010585455; ISBN: 0-7803-7335-9.

Hynecek, J., "BCMD-An Improved Photosite Structure for High-Density Image Sensors," IEEE Transactions on Electron Devices, vol. 38, No. 5, May 1991; IEEE Log No. 9143222.

Preliminary French Search Report, FR 05 04835, dated Nov. 18, 2005.

Patent Abstracts of Japan, vol. 2003, No. 11, Nov. 5, 2003; and JP 2003 188367, Jul. 4, 2003.

Patent Abstracts of Japan, vol 2000, No. 19, Jun. 5, 2000; and JP 2001 053260 A, Feb. 23, 2001.

Machine English Translation of JP2001-053260.

* cited by examiner

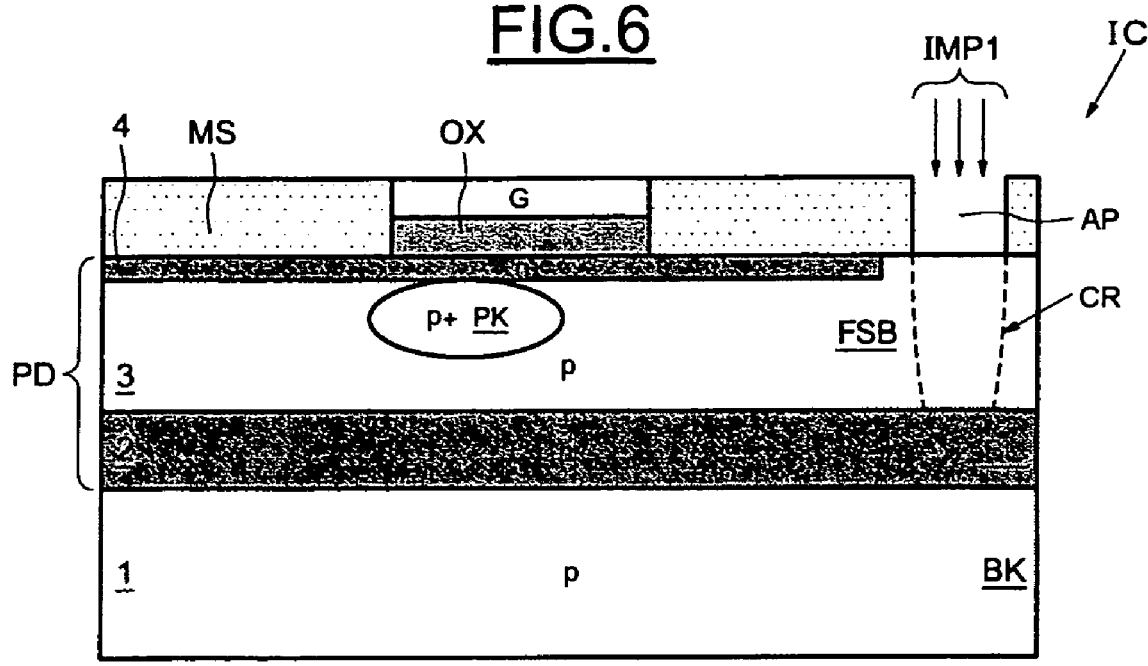
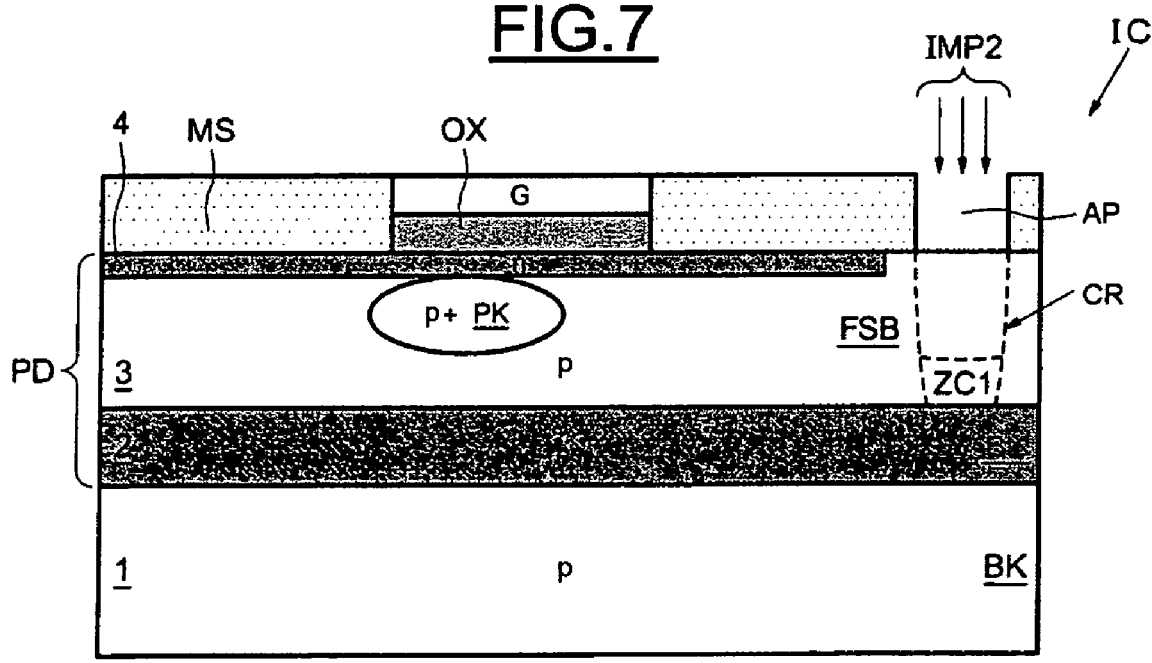

INTEGRATED CIRCUIT COMPRISING A PHOTODIODE OF THE FLOATING SUBSTRATE TYPE AND CORRESPONDING FABRICATION PROCESS

PRIORITY CLAIM

The present application claims priority from French Application for Patent No. 05 04835 filed May 13, 2005, the disclosure of which is hereby incorporated by reference.

BACKGROUND OF THE INVENTION

1. Technical Field of the Invention

The present invention relates to microelectronics, and especially to integrated circuits comprising photodiodes of the floating substrate type.

2. Description of Related Art

Image sensors based on semiconductor components advantageously rely on the principle of photons being converted into electron/hole pairs in silicon. More precisely, the charges created in photosensitive regions are stored in the photodiode and are then read by an electronic system. This electronic system, which controls the photodiode, comprises in particular a read transistor for converting the charges stored in the photodiode into an electrical quantity.

The present invention applies advantageously but without limitation to CMOS image sensors and more particularly to VMIS sensors (Vth modulation image sensors) which are image sensors that rely on the modulation of the threshold voltage of an MOS transistor. The reader may refer on this subject to the article by Takashi Miida et al., "A 1.5 Mpixel Imager with Localized Hole Modulation Method", ISSCC Dig. Tech. Pap., pp. 42-43, July 2002, the disclosure of which is hereby incorporated by reference.

This type of CMOS transistor consists of a buried photodiode and an MOS transistor, owing to the fact that its substrate is a floating substrate, that is to say its potential can only be reached via an electrode, for example. This floating substrate acts as a charge storage region during charge integration, that is to say when the incident light generates electron/hole pairs in the photosensitive regions.

Another type of transistor to which the invention advantageously applies is a transistor of the BCMD (bulk charge modulated device) type. This transistor includes, in particular, a storage area or pocket located beneath the gate of the transistor so as to make it easier to integrate the charges. These transistors are described specifically in the article by Jaroslav Hynecek entitled "BCMD—an improved photosite structure for high density image sensors", IEEE Transactions On Electron Devices, Vol. 38, No. 5, May 1991, the disclosure of which is hereby incorporated by reference.

Conventionally, the operation of an integrated circuit that includes a photodiode associated with a read transistor operates in three separate phases, namely an integration phase, a read phase and a reset phase.

During the integration phase, the charges photogenerated in the photosensitive regions of the photodiode by the incident photons are attracted into and then stored in the floating substrate and more particularly at the pocket lying beneath the gate of the transistor in the case of BCMD-type transistors, for example. This charge accumulation results in a variation in the threshold voltage of the MOS transistor, which is measured during the read phase, by connecting the transistor in what is called a "source follower" mode and by reading the source bias.

During the reset phase, the accumulated charges are expelled from the floating substrate into the bulk of the photodiode via a buried layer, included in the layer of the photodiode that lies between the floating substrate and the bulk. Said buried layer constitutes a barrier for the charges photogenerated during the first two phases.

After the reset phase, the floating substrate and the buried layer are then completely drained of its charges.

To optimize the reset phase, the aim is to obtain a maximum voltage amplitude between the bulk and the upper layer of the photodiode. To do this, voltages of around 6 to 8 volts are applied both to the gate and to the drain, that is to say voltages that are very much higher than the standard bias voltages generally used at the present time in CMOS technology, which vary between 0 and 3.3 volts.

This is because, since the buried layer is connected to the drain, the buried layer bias tends to align with the drain bias. In addition, in order to direct the charges into the photodiode bulk during the reset phase, it is necessary to use relatively high voltages and also the doping levels and the thickness of the buried layer must be controlled very precisely during production, something which is not very easily achievable.

Moreover, during the integration phase, the floating substrate bias must be able to reach a minimum value so that the potential difference between a floating substrate drained of charges and full of charges, called the "voltage swing", is as high as possible.

Consequently, to favor the integration and read phases and thus optimize the electronic performance of the circuit (for example, the dynamic range of the output voltage of the circuit), it is preferable for the pocket to be highly doped.

In contrast, a low pocket doping level favors the reset phase.

There is a need to provide a solution to these problems.

SUMMARY OF THE INVENTION

The present invention proposes an integrated circuit that includes a photodiode with an optimum reset phase without degrading the integration and read phases. For this purpose, according to a first aspect, the invention proposes an integrated circuit comprising at least one photodiode associated with a read transistor, said photodiode comprising a stack of three semiconductor layers comprising a buried layer and an upper layer that incorporates the drain region and/or the source region of the transistor.

According to one general feature of this first aspect of the invention, the buried layer is electrically isolated from the upper layer and can be biased independently of the upper layer.

Thus, it is possible to use a highly doped pocket (with a doping level of up to three times more than that for a standard photodiode) so as to optimize the performance of the circuit during the integration and read phases, and then to perform an effective reset despite the high doping of the pocket. This is because the reset is carried out by biasing the buried layer with a minimum voltage, while still applying a voltage to the drain consistent with the standard bias voltages generally used in CMOS technology, for example 3.3 volts.

In other words, during the reset phase, instead of increasing the amplitude of the voltage between the buried layer and the drain, the circuit operates by increasing the drain bias voltage, and the buried layer bias voltage is decreased and then fixed to a minimum value.

This is because, according to this first aspect of the invention, it is possible during the reset phase to bias the buried layer of the photodiode at around 0 volts. Since the potential of the buried layer is fixed and low, by biasing the drain to 3.3 volts the voltage amplitude between the buried layer and the upper layer during the reset phase is high enough for the latter to be optimal.

Furthermore, by biasing the buried layer independently of the upper layer, the deleterious effects due to lack of control on the biasing of the buried layer between the reset phase and the integration phase are reduced.

According to one embodiment of this first aspect, the integrated circuit includes a semiconductor contact region of the same conductivity type as the buried layer and electrically isolated from the upper layer, said contact region being formed between the external surface of the integrated circuit and the buried layer so as to be able to bias said buried layer.

This contact region makes it possible for the buried layer to be biased directly using an electrode, especially for the reset phase.

The contact region may for example be electrically isolated from the upper layer by a pn junction formed between the contact region and the middle layer of the stack, said upper layer lying above one part of the middle layer.

As a variant, the contact region may be isolated from the upper layer by an isolating trench that extends from the upper surface of the upper layer down to beyond the upper surface of the middle layer of the stack.

This isolating layer has the advantage of being particularly narrow, thereby greatly reducing the area of the integrated circuit.

Preferably, the contact region comprises an upper region, an intermediate region which is less highly doped than the upper region, and a lower region less highly doped than the intermediate region.

The advantage of varying the doping of the contact region is that it is easier to bias the buried layer at a minimal voltage.

The lower region may for example be doped with a dopant concentration of the order of $10^{17}$ at/cm$^3$.

The intermediate region may for example be doped with a dopant concentration of the order of $10^{18}$ at/cm$^3$.

The upper region may for example be doped with a dopant concentration of the order of $10^{19}$ to $10^{20}$ at/cm$^3$.

According to another aspect, the invention proposes an image sensor comprising at least one pixel associated with an integrated circuit as defined above.

According to another aspect, the invention proposes a process for fabricating an integrated circuit comprising the production of a photodiode and of a read transistor, the production of said photodiode comprising the formation of a stack of three semiconductor layers, said formation of the stack comprising the production of a buried layer and the formation of an upper layer on which the source region and/or drain region are produced.

According to a general feature of this other aspect of the invention, the buried layer is electrically isolated from the upper layer so that said buried layer can be biased independently of the upper layer.

Preferably, before the drain region or source region of the transistor is produced, a contact region is produced between the external surface of the integrated circuit and the buried layer, said contact region being made of a semiconductor of the same conductivity type as the buried layer and electrically isolated from the upper layer so as to be able to bias said buried layer.

Preferably, the upper layer is produced on one part of the middle layer of the stack and the contact region is electrically isolated from the upper layer by a pn junction formed between the contact region and the middle layer of the stack.

As a variant, the contact region is isolated from the upper layer by an isolating trench that extends from the upper surface of the upper layer down to beyond the upper surface of the middle layer of the stack.

Preferably, the contact region is produced by three successive implantations so as to create a lower region, an intermediate region and then an upper region at the same time as the production of the source and drain regions of the transistor, so that said upper region is more highly doped than the intermediate region, which is itself more highly doped than the lower region.

For example, the lower region may preferably be doped using doses of around $6 \times 10^{12}$ at/cm$^2$.

The intermediate region may preferably be doped using doses of the order of $10^3$ at/cm$^2$.

The upper region may for its part preferably be doped using doses of the order of $10^{15}$ at/cm$^2$.

In accordance with an embodiment of the invention, an integrated circuit comprises a buried layer of a first conductivity type, an intermediate layer of a second conductivity type on top of the buried layer, and a top layer of the first conductivity type and including source and drain regions above the intermediate layer. A gate structure is placed above the top layer and between the source and drain regions. An electrical contact region extends through the intermediate layer to support independent biasing of the buried layer. The buried layer, intermediate layer and top layer form a photodiode and the gate structure, source region and drain region form a read transistor for that photodiode.

BRIEF DESCRIPTION OF THE DRAWINGS

A more complete understanding of the method and apparatus of the present invention may be acquired by reference to the following Detailed Description when taken in conjunction with the accompanying Drawings wherein:

FIGS. 4 to 10 illustrate schematically the main steps of one method of implementing the process of fabricating an integrated circuit according to the invention;

DETAILED DESCRIPTION OF THE PREFERRED EMBODIMENTS

Figure 1:
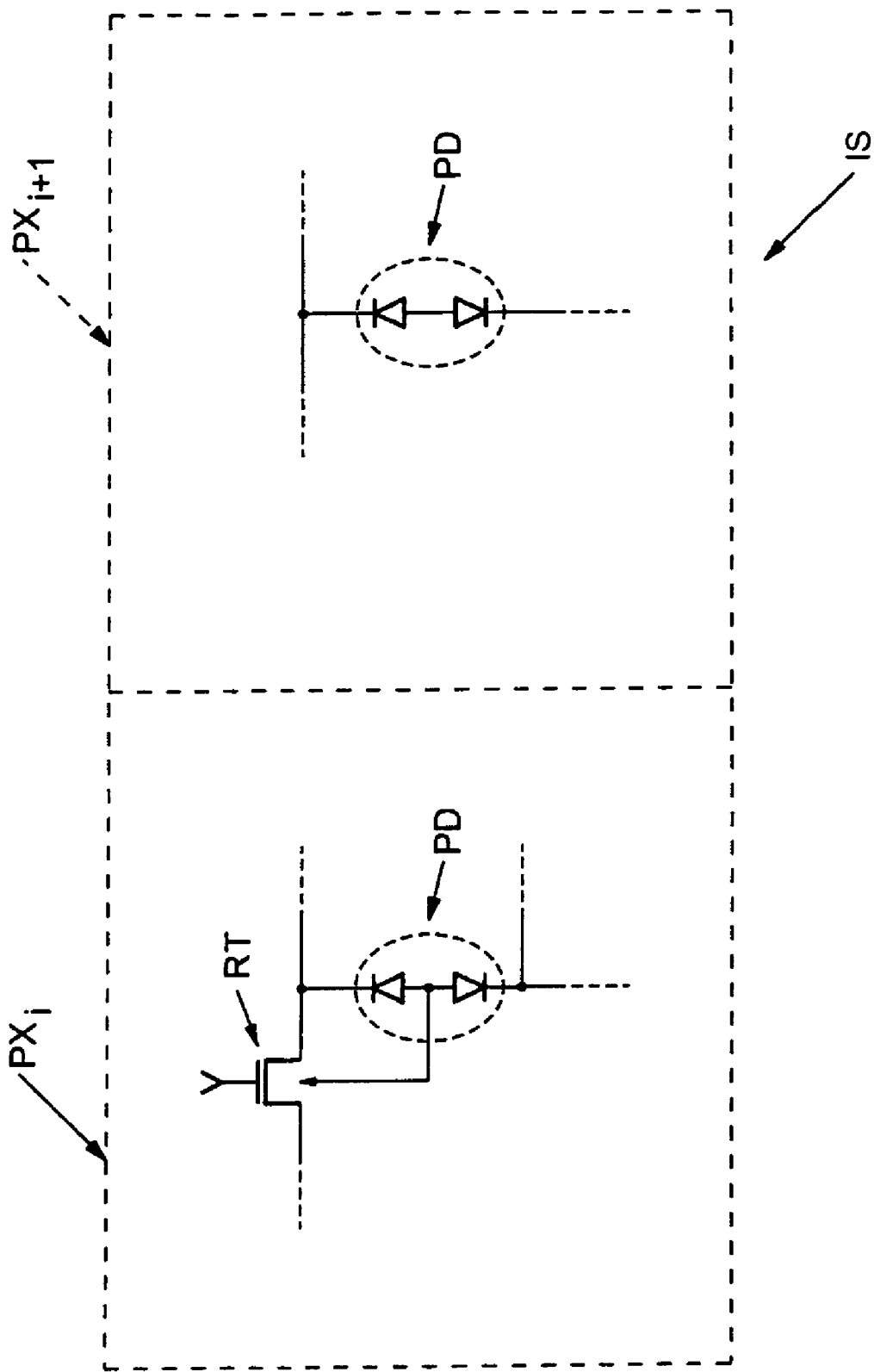
FIG. 1 illustrates schematically an image sensor according to the invention, formed from several cells equipped with photodiodes according to the invention.

In FIG. 1, the reference IS denotes in general an image sensor formed from a matrix of cells (or pixels) $PX_i$, each comprising a photodiode PD and a read transistor RT connected to the photodiode PD. Each cell $PX_i$ may include additional control means connected to the read transistor RT, for example a reset transistor, a select transistor and a follower transistor.

Figure 2:
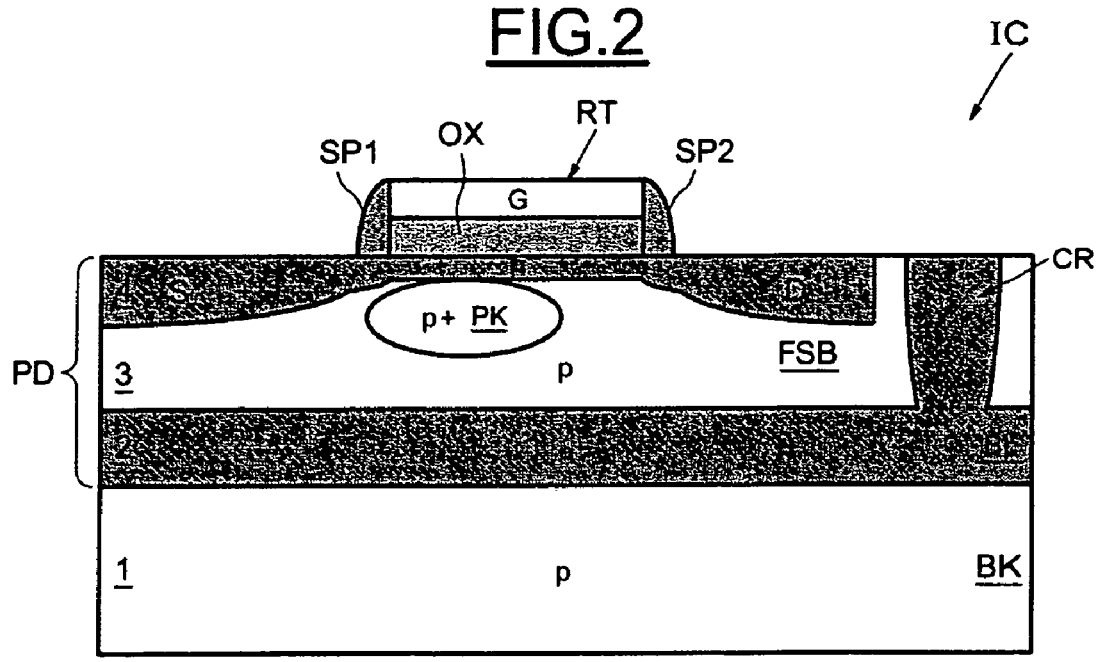
FIG. 2 shows one embodiment of an integrated circuit according to the invention.

FIG. 2 shows in greater detail the semiconductor structure of the photodiode PD of a cell $PX_i$.

The reference IC denotes an integrated circuit according to a first embodiment of the invention, comprising the photodiode PD formed on a layer 1 of substrate or bulk BK, which here is p-doped and constitutes the support for the integrated circuit.

The integrated circuit IC also includes the read transistor RT for a cell $PX_i$.

The photodiode PD includes a stack of semiconductor layers 2, 3 and 4 that are located above the bulk layer 1.

This stack comprises a semiconductor layer 2, here n doped, above the bulk BK.

The layer 2 forms a buried layer BL, that is to say a barrier for the charges photogenerated in the photosensitive region of the photodiode PD.

The buried layer BL is surmounted by a middle layer 3, which comprises a floating substrate region FSB, that is to say a closed region whose potential can be modified or reached only using for example an electrode.

The floating substrate region FSB includes, in this example, a $p^+$-overdoped storage area or pocket PK. This is because instead of storing the photogenerated charges in the entire floating substrate FSB, they are stored in the pocket PK located beneath the gate G of the read transistor RT. However, this embodiment may also apply to photodiodes comprising a floating substrate with no pockets.

The integrated circuit IC includes a final layer 4, here n-doped, so as to produce the photodiode PD.

This n-doped final layer 4 includes the source S and the drain D of the read transistor RT, these two regions being $n^+$-doped. In the case of a CMOS image sensor, a read transistor is associated with each pixel.

On top of the semiconductor multilayer stack is the gate G of the read transistor RT, said gate being isolated from the semiconductor multilayer stack by an oxide layer OX.

Furthermore, the read transistor RT includes, in this example, two spacers SP1 and SP2 on each side of the gate G.

The photodiode PD is therefore formed here from three layers defining two pn junctions (diodes), namely an upper junction formed by the n-doped layer 4 and the p-doped middle layer 3, serving to form the floating substrate region FSB, and a lower junction formed from the layer 3 and the layer 2 of the buried layer BL. The final layer 1 forming the bulk BK serves as substrate and has a fixed and constant polarity.

Moreover, so as to be able to adjust the potential of the buried layer BL, the photodiode PD includes, within the floating substrate region FSB, a semiconductor contact region CR of the same polarity type as the buried layer, that is to say n in this example.

The contact region CR and the buried layer BL are isolated from the upper layer comprising the drain and source regions by a pn junction formed between the p-doped floating substrate FSB and the n-doped contact region CR.

Figure 3:
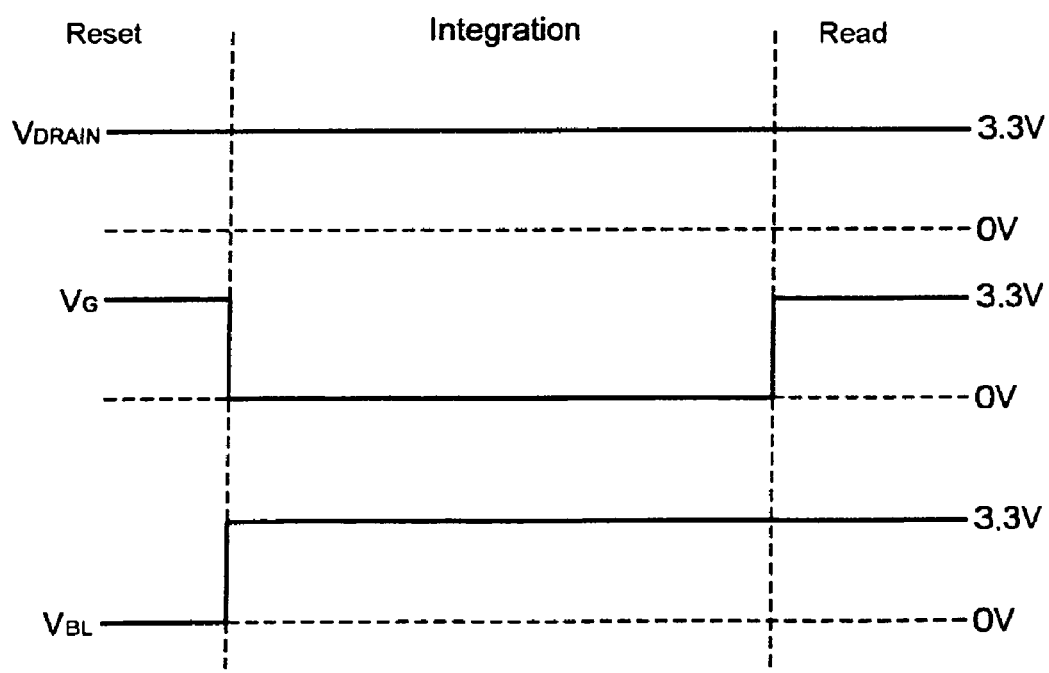
FIG. 3 shows the phases in the operation of an integrated circuit according to the invention.
Figure 4:
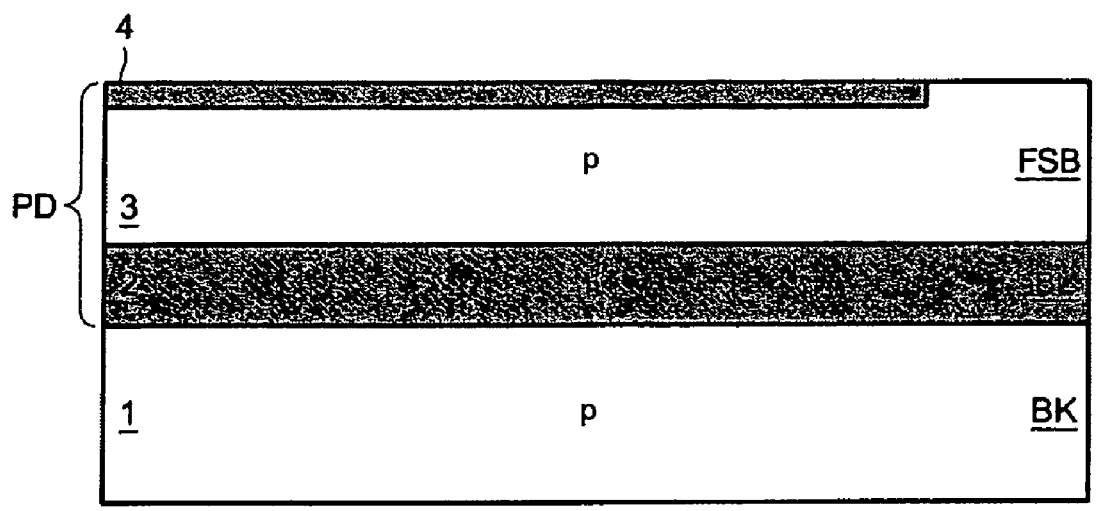
Figure 5:
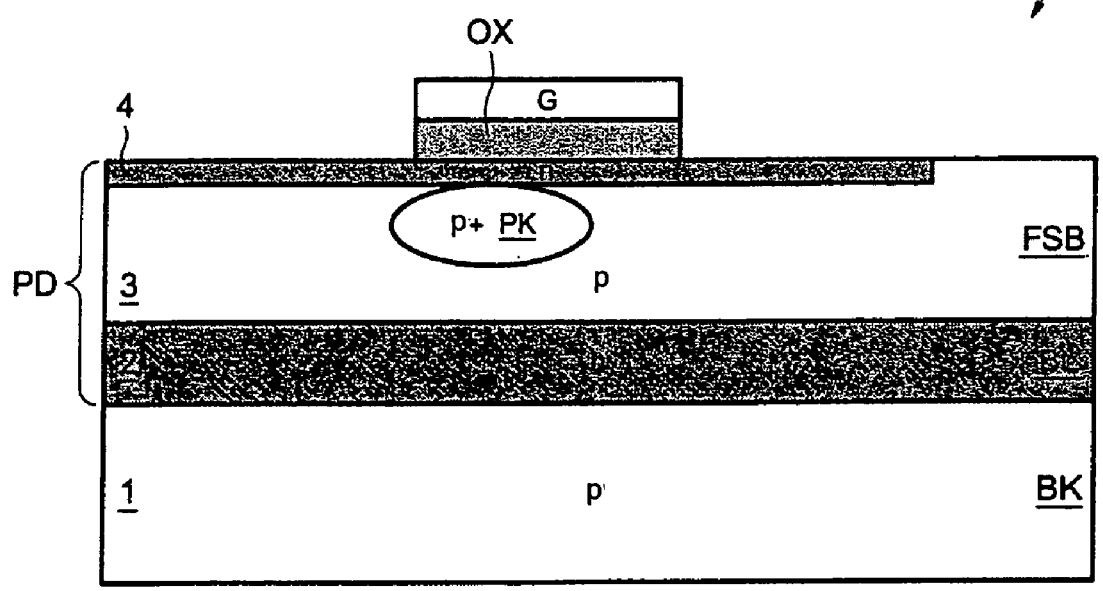

The timing diagram in FIG. 3 illustrates, for the various operating phases of the photodiode, the variations in the voltages applied to the drain, to the gate and to the buried layer.

Throughout the operation of the photodiode, the drain bias is kept constant with a low bias voltage, here 3.3 volts.

As for the gate voltage, this varies between the maximum voltage, here 3.3 volts, during the reset and read phases and the minimum voltage, here 0 volts, during the integration phase.

As regards the buried layer bias, this varies between the minimum voltage, here around 0 volts, during the reset phase and the maximum voltage, here 3.3 volts, during the integration and read phases.

By being able to adjust the potential of the buried layer, it is then possible to reduce it to the minimum, while still ensuring that the diode, created between the bulk BK and the buried layer BL, does not pass into forward bias mode. What is then produced, during the reset phase, is what is commonly called by those skilled in the art a "potential slope" between the drain region at 3.3 volts and the buried layer at 0 volts. This "potential slope" thus created makes it possible to optimize the depletion of the buried layer BL while still using standard bias voltages.

Consequently, the integrated circuit IC according to the invention makes it possible to carry out the various reset, integration and read phases by means of voltages whose amplitude varies between 0 and 3.3 volts, as illustrated in FIG. 3.

The main steps of one method of implementing the process for producing the integrated circuit shown in FIG. 2, according to the invention, will now be described with reference more particularly to FIGS. 4 to 10.

Firstly (FIG. 4), the stack of semiconductor layers 2, 3 and 4 that form the photodiode PD is produced on the layer 1 serving as bulk BK, which is p-doped here.

The layer 2 of the photodiode, here n-doped, defines the buried layer BL. The middle layer 3, here p-doped, is the layer of the stack serving for producing the floating substrate region FSB of the photodiode PD. The n doped semiconductor layer 4 is for its part produced on part of the middle layer 3.

After the stack of semiconductor layers 1 to 4 have been conventionally produced, the process continues in a conventional manner (FIG. 5) with the formation of the pocket by implantation and then the gate G of the read transistor RT, said gate resting on the n-doped semiconductor layer 4 which itself lies above the pocket. The gate G is separated from the upper layer 4 of the photodiode by an oxide layer OX. It is possible for the pocket not to be produced, the charges then being stored in the floating substrate FSB.

Next (FIG. 6), a resist layer is deposited on the upper layer 4 and on that part of the middle layer 3 which is not covered by the layer 4. An aperture AP located on the middle layer 3 not covered by the layer 4 is then defined by etching the resist. Consequently, a resist mask MS is formed on the layer 4 and on part of the layer 3. Only the aperture AP, resulting from etching the resist, remains on the exposed part of the layer 3, as shown in FIG. 6.

Once the mask MS has been formed, a first implantation IMP1 is carried out so as to create the contact region CR allowing the buried layer BL to be contacted. This first implantation must be carried out at a relatively large depth so that the contact region passes through the layer 3 as far as the buried layer BL. For example, in 0.13 μm technology, the implantation may be carried out to a depth of 0.6 μm with doses of around $6\times10^{12}$ at/cm$^2$ and an energy of 800 keV. The dopants used may for example be phosphorous dopants. More generally, the doping process may use any electrically active dopant gas, of n type in this case or of p type in the case of a transistor with a p-channel (or pMOS transistor).

As may be seen in FIG. 7, after the first implantation IMP1, a second implantation IMP2 is carried out in the aperture AP, again with the same mask MS.

The depth of the implantation IMP2 is less than that of the implantation IMP1. Preferably it is around 0.4 μm using doses having a concentration of the order of $10^{13}$ at/cm$^2$ with an energy of 400 keV.

Figure 8:
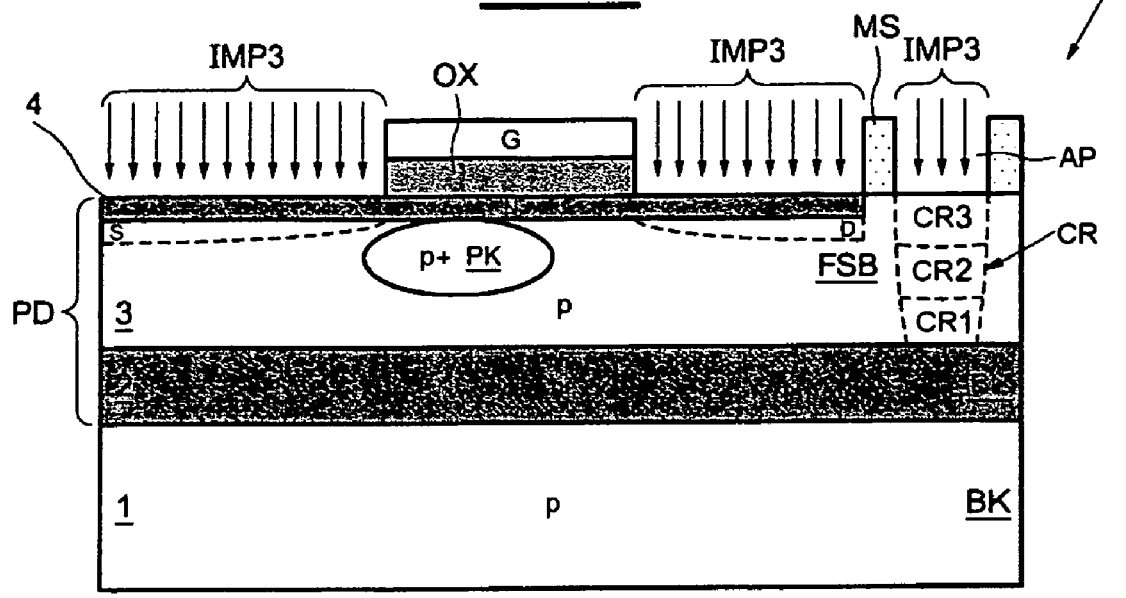
Figure 9:
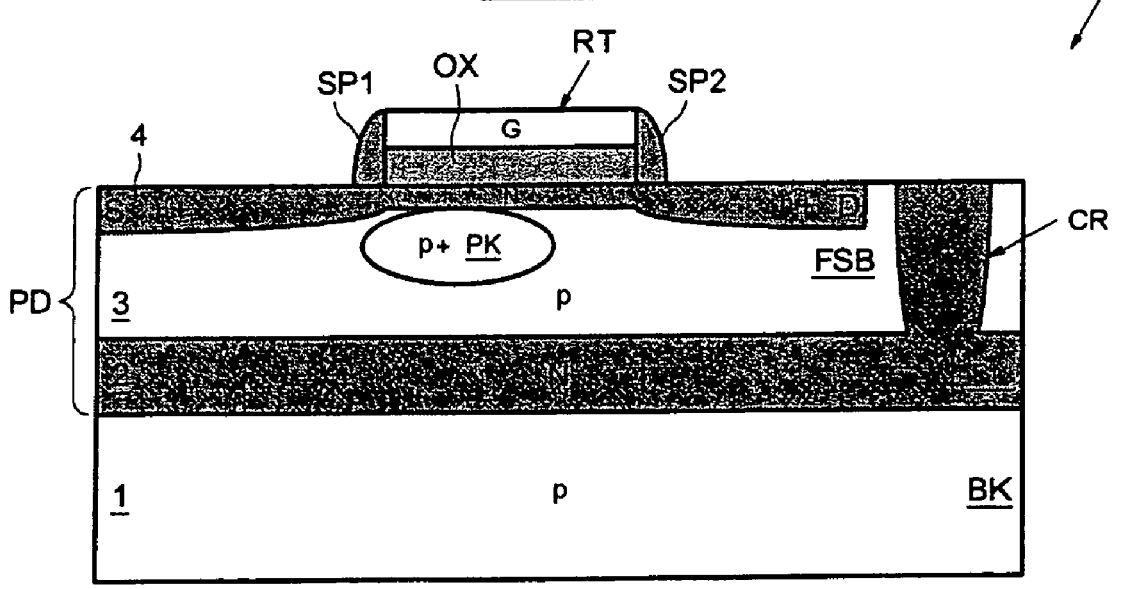
Figure 10:
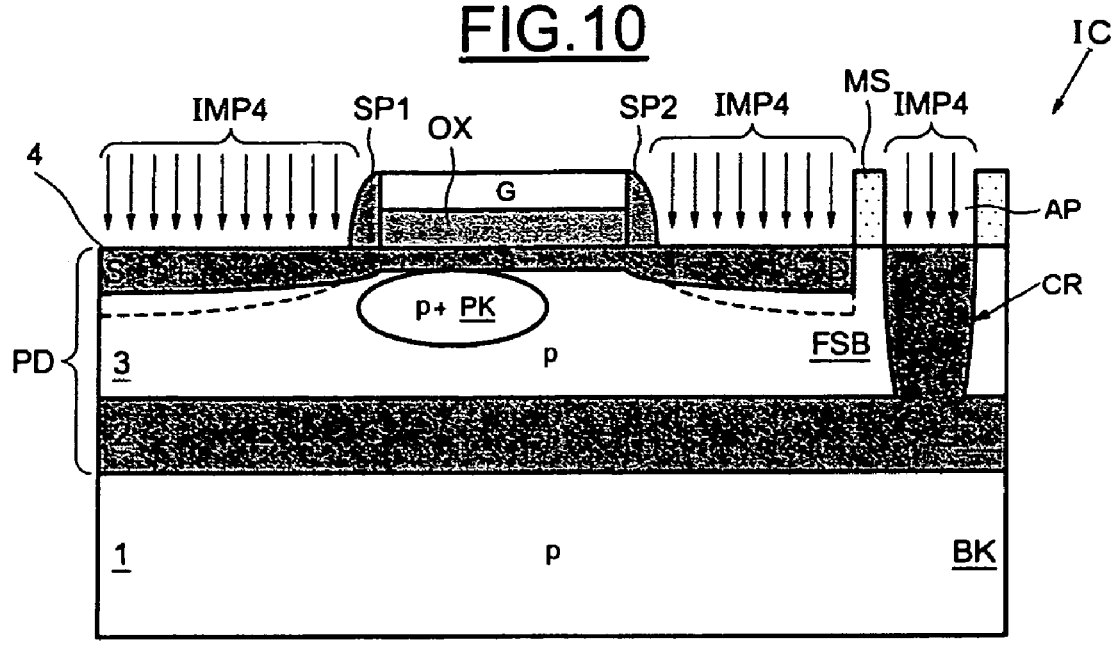

After the second implantation IMP2, the resist mask is removed and another mask MS is formed, according to the procedure as described above, on that part of the layer 3 which is not covered by the upper layer 4 and in such a way as to retain the aperture AP (FIG. 8). The upper layer 4 is entirely exposed, with the exception of the part covered by the gate G of the transistor RT. Next, a third implantation IMP3 is carried out so as to obtain the n+-doped source S and drain D regions. The third implantation IMP3 is also carried out through the aperture AP, so as to implant into the contact region CR, doses of dopants having a concentration of the order of $10^{15}$ at/cm$^2$ and at a depth of 0.1 μm, preferably with an energy of a few keV.

Thus, as a result of the three implantations IMP1, IMP2 and IMP3, three separate regions are obtained in the contact region CR, these being CR1, CR2 and CR3.

The concentration of the various regions CR1 to CR3 goes from the lowest to the highest so as to promote, during the reset phase, the biasing of the buried layer BL at a low voltage.

Next (FIG. 9), the spacers SP1 and SP2 for the transistor RT on top of the layer 4 are produced, in a conventional manner known per se, along the sidewalls of the gate G.

It is then possible (FIG. 10) to carry out a fourth implantation IMP4 after a mask MS has been formed above the exposed part of the layer 3, so as to dope the source and drain regions S and D more deeply.

The mask MS may again include an aperture AP so that the contact region CR benefits from the latter implantation IMP4.

Figure 11:
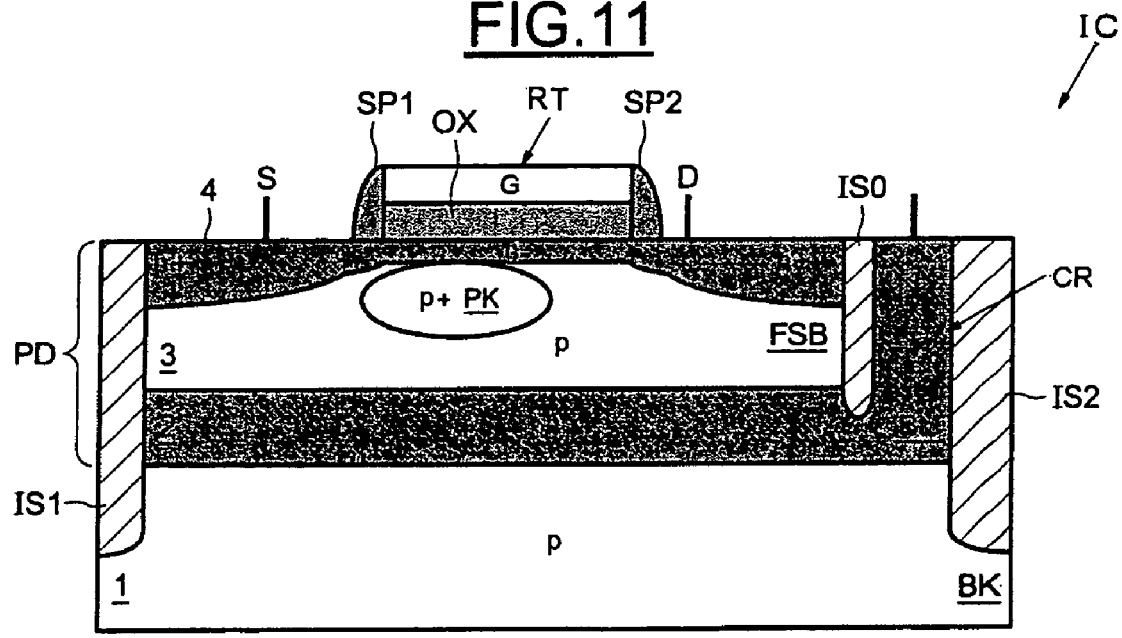
FIG. 11 shows another embodiment of an integrated circuit according to the invention.

FIG. 11 shows another embodiment of the integrated circuit according to the invention.

According to this other embodiment, the integrated circuit IC includes, between the upper layer 4 and the middle layer 3, on the one hand, and the contact region CR on the other, an isolating trench IS0 that extends from the upper surface of the upper layer 4 down to beyond the upper surface of the middle layer of the stack.

The isolating trench IS0 may be for example of the MTI (medium trench isolation) type. In this case, the insulating material used may for example be silicon dioxide.

This type of isolation has the advantage of allowing particularly compact integrated circuits to be produced, since the width of the isolating trench is between 0.2 and 0.3 μm, whereas the width on the surface of the integrated circuit of the isolation produced by the pn junction varies between 0.6 and 0.7 μm.

Of course, it would be possible to produce an isolating trench of the STI (shallow trench isolation) type between the upper layer and the contact region, but, by forming an isolating trench that extends only as far as the buried layer and not beyond the upper layer, any diffusion of the implantation dopants used to produce the contact region CR, which diffusion would therefore cause a short circuit between the buried layer BL and the upper layer 4, is avoided.

This is because, if the isolating trench were to be shorter, there would then be a high risk of having a short circuit between the contacting region, and therefore the buried layer BL, and the upper layer 4 comprising the source S, the drain D and the photosensitive region of the photodiode PD.

Isolating regions IS1 and IS2, for example isolations of the "localized oxidation" or LOCOS (using the name well known to those skilled in the art) type have been added in order to electrically isolate the integrated circuit IC from adjacent circuits produced on the same bulk.

It is possible to produce the integrated circuit according to the invention on silicon with various topologies. Two configurations are shown below by way of example, these in no way being limiting.

Figure 12:
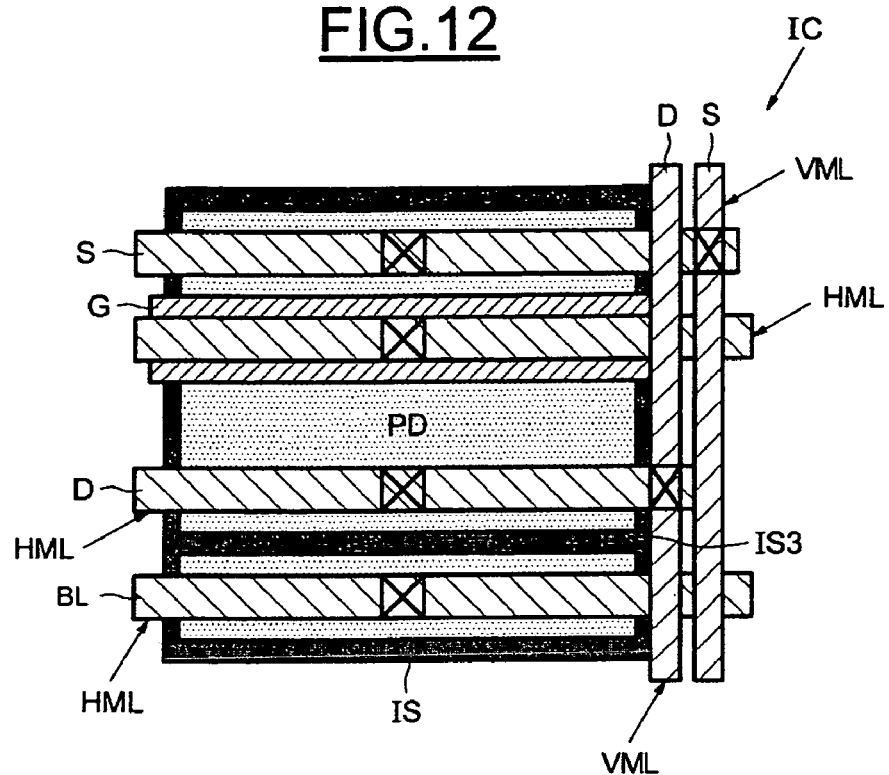
FIGS. 12 to 14 show various examples of an integrated circuit according to the invention produced on silicon.

For example, FIG. 12 shows the photodiode PD surrounded by an insulator IS. This insulator may be produced by a pn junction, associated with an isolation of the LOCOS type.

The photodiode PD comprises three horizontal metallization lines HML for contacting the source S, gate G and drain D regions.

Furthermore, the circuit additionally includes two vertical metallization lines VML so as to allow a second point of contact on the source S and drain D regions.

The integrated circuit IC also includes isolation IS3 between the photodiode and a fourth horizontal metallization line HML, allowing the buried layer BL to be contacted. This isolation IS3 may be produced for example by a pn junction or isolation of the MTI type described above.

Figure 13:
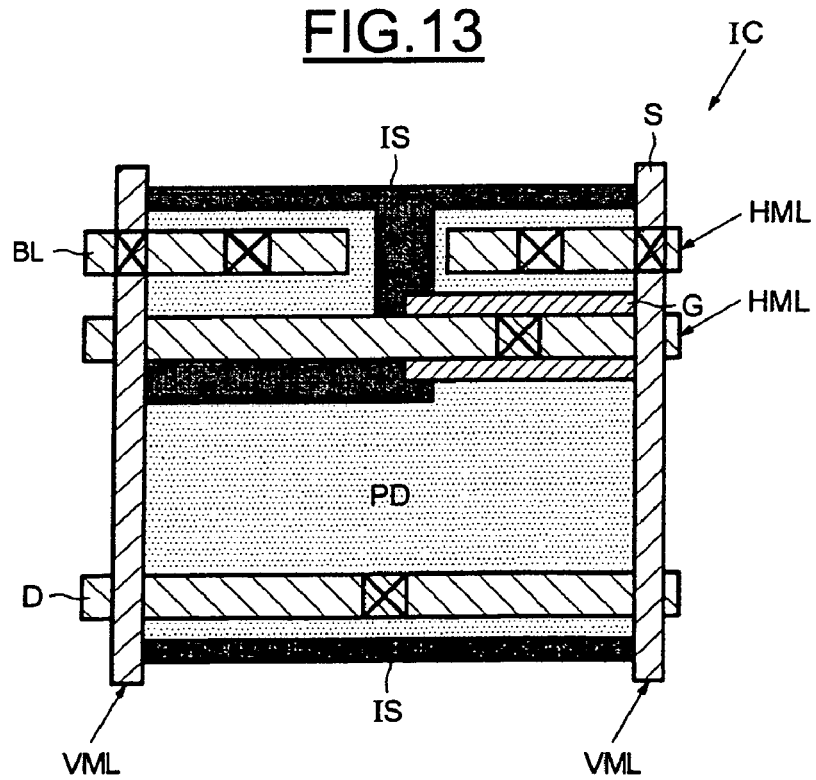

FIG. 13 shows another possible topology for the construction of the integrated circuit IC according to the invention. In this case, apart from the fact of surrounding the photodiode PD, the isolation IS separates and isolates the buried layer BL from the source region S, so as to be able to produce two contacting regions with the same width of the integrated circuit. This topology makes it possible to produce a particularly compact integrated circuit.

Figure 14:
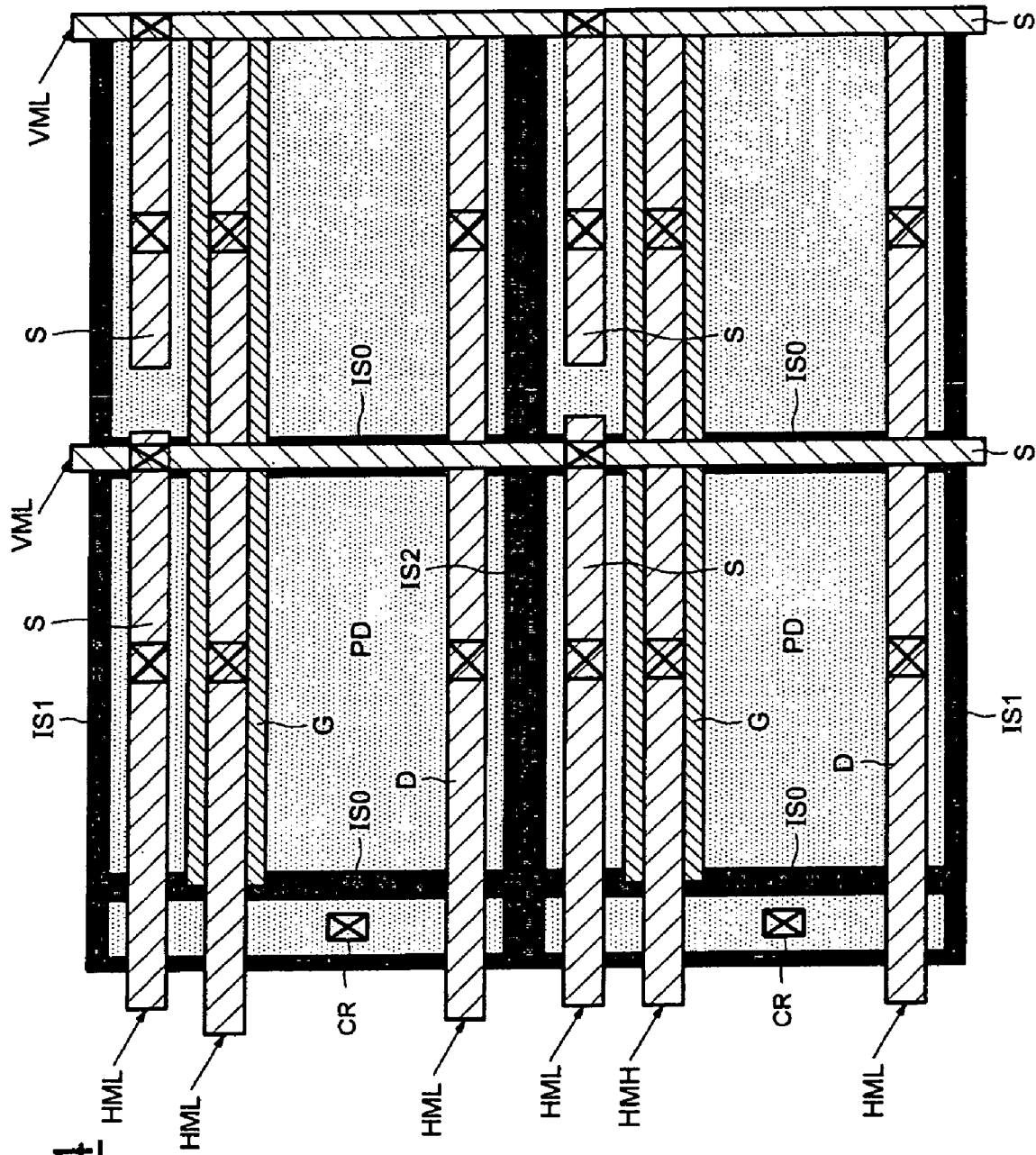

FIG. 14 illustrates an example of the topology for an integrated circuit according to the invention in the case in which each read transistor is associated with a pixel belonging to a line-driven matrix of pixels.

In this figure, each line of the matrix comprises two pixels produced on the same semiconductor multilayer stack. The intermediate regions of each pixel of a line of the matrix are isolated by an isolation trench ISO. However, the buried layer for these pixels is common to each of them.

Consequently, it is possible to bias the buried layer for all of the pixels of any one line by producing a single contact region, for example at one of the ends of the line of pixels, as shown in FIG. 14.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An integrated circuit, comprising:
   at least one photodiode associated with a read transistor, said photodiode comprising a stack of three semiconductor layers including a buried layer, a floating substrate layer and an upper layer, wherein the upper layer incorporates a drain region of the read transistor,
   wherein the buried layer is electrically isolated from the drain region in the upper layer and wherein the buried layer is adapted to receive a bias voltage independent of any voltage on the upper layer; and
   further including a semiconductor contact region of a same conductivity type as the buried layer and a structure for electrically isolating the semiconductor contact region from the upper layer,
   said semiconductor contact region being formed in electrical connection with the buried layer so as to support application of the bias voltage to said buried layer;
   wherein the semiconductor contact region comprises an upper region, an intermediate region which has a lower dopant concentration than the upper region, and a lower region which has a lower dopant concentration than the intermediate region, the lower region being in contact with the buried layer.

2. The integrated circuit according to claim 1, wherein the structure for electrically isolating is a pn junction that electrically isolates the contact region from the upper layer, the pn junction formed between the contact region and the floating substrate layer, said upper layer lying above at least one part of said floating substrate layer.

3. The integrated circuit according to claim 1, wherein the structure for electrically isolating is an isolating trench between the contact region and upper layer that extends from an upper surface of the upper layer down to beyond an upper surface of the floating substrate layer of the stack.

4. The integrated circuit according to claim 1, in which the lower region is doped with a dopant concentration of the order of $6\times10^{12}$ at/cm$^2$.

5. The integrated circuit according to claim 4, in which the intermediate region is doped with a dopant concentration of the order of $10^{13}$ at/cm$^2$.

6. The integrated circuit according to claim 5, in which the upper region is doped with a dopant concentration of the order of $10^{15}$ at/cm$^2$.

7. An integrated circuit, comprising:
a buried layer of a first conductivity type;
an intermediate layer of a second conductivity type on top of the buried layer;
a top layer of the first conductivity type and including source and drain regions above the intermediate layer;
a gate structure above the top layer and between the source and drain regions;
an electrical contact region extending through the intermediate layer; and
means for electrically isolating the electrical contact region from the top layer to support application of a bias voltage to the buried layer which is different from a voltage on the top layer;
wherein the buried layer, intermediate layer and top layer form a photodiode and the gate structure, source region and drain region form a read transistor for that photodiode; and
wherein the electrical contact region comprises an upper region, an intermediate region which has a lower dopant concentration than the upper region, and a lower region which has a lower dopant concentration than the intermediate region, the lower region being in contact with the buried layer.

8. The integrated circuit of claim 7 further including an over-doped pocket region of the second conductivity type within the intermediate layer, the over-doped pocket region being located underneath the gate structure and between the source and drain regions.

9. The integrated circuit of claim 7 wherein the means for electrically isolating comprises a pn junction formed in part by the intermediate layer which isolates the electrical contact region from the top layer.

10. The integrated circuit of claim 7 wherein the means for electrically isolating comprises a trench-based isolation structure which isolates the electrical contact region from the top layer.

11. An integrated circuit, comprising:
a buried layer of a first conductivity type;
an intermediate layer of a second conductivity type on top of the buried layer;
a top layer of the first conductivity type and including source and drain regions above the intermediate layer;
a gate structure above the top layer and between the source and drain regions;
an electrical contact region extending through the intermediate layer; and
an electrical isolation structure between the electrical contact region and the top layer to support a voltage on the top layer which is independent of a bias voltage applied to the buried layer;
wherein the buried layer, intermediate layer and top layer form a photodiode and the gate structure, source region and drain region form a read transistor for that photodiode; and
wherein the electrical contact region comprises an upper region, an intermediate region which has a lower dopant concentration than the upper region, and a lower region which has a lower dopant concentration than the intermediate region, the lower region being in contact with the buried layer.

12. The integrated circuit of claim 11 further including an over-doped pocket region of the second conductivity type within the intermediate layer, the over-doped pocket region being located underneath the gate structure and between the source and drain regions.

13. The integrated circuit of claim 11 wherein the electrical isolation structure comprises a pn junction formed in part by the intermediate layer which isolates the electrical contact region from the top layer.

14. The integrated circuit of claim 11 wherein the electrical isolation structure comprises a trench-based isolation structure which isolates the electrical contact region from the top layer.

* * * * *